United States Patent [19]
Nitta et al.

[11] Patent Number: 5,945,248
[45] Date of Patent: Aug. 31, 1999

[54] CHEMICAL-SENSITIZATION POSITIVE-WORKING PHOTORESIST COMPOSITION

[75] Inventors: Kazuyuki Nitta, Ebina; Kazufumi Sato, Sagamihara; Akiyoshi Yamazaki, Yokohama; Yoshika Sakai, Atsugi; Toshimasa Nakayama, Chigasaki, all of Japan

[73] Assignee: Tokyo Ohka Kogyo Co., Ltd., Japan

[21] Appl. No.: 08/898,124

[22] Filed: Jul. 22, 1997

[30] Foreign Application Priority Data

Jul. 24, 1996 [JP] Japan .................................. 8-195099

[51] Int. Cl.$^6$ .............................. G03F 7/039; G03C 1/52
[52] U.S. Cl. ...................... 430/170; 430/270.1; 430/905; 430/920
[58] Field of Search ................................ 430/170, 270.1, 430/189, 920, 905

[56] References Cited

U.S. PATENT DOCUMENTS

| | | | |
|---|---|---|---|
| 5,110,709 | 5/1992 | Aoai et al. | |
| 5,216,135 | 6/1993 | Urano et al. | 534/556 |
| 5,338,641 | 8/1994 | Pawlowski et al. | 430/165 |
| 5,350,660 | 9/1994 | Urano et al. | 430/176 |
| 5,424,166 | 6/1995 | Pawlowski et al. | 430/157 |

FOREIGN PATENT DOCUMENTS

| | | |
|---|---|---|
| 0 535 653 | 4/1993 | European Pat. Off. . |
| 61-166544 | 7/1986 | Japan . |

*Primary Examiner*—John S. Chu
*Attorney, Agent, or Firm*—Wenderoth, Lind & Ponack, L.L.P.

[57] ABSTRACT

Proposed is a positive-working chemical-sensitization photoresist composition having advantages in respect of high resolution of patterning, high photosensitivity and orthogonal cross sectional profile of the patterned resist layer as well as in respect of little dependency of the performance on the nature of the substrate surface. The composition comprises:

(A) 100 parts by weight of a film-forming hydroxyl-containing resin of a specified narrow molecular weight distribution substituted by acid-dissociable groups for a part of the hydroxyl groups which causes an increase of solubility in an aqueous alkaline solution by the interaction with an acid; and (B) from 0.5 to 20 parts by weight of a radiation-sensitive acid-generating agent which is a disulfone compound represented by the general formula

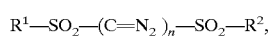

$$R^1-SO_2-(C=N_2)_n-SO_2-R^2,$$

in which the subscript n is 0 or 1 and $R^1$ and $R^2$ are each, independently from the other, a monovalent cyclic group selected from the group consisting of pyridyl group, benzoxazolyl group and aryl groups substituted by at least one amino group or dialkylamino group, such as bis(4-pyridylsulfonyl) diazomethane, bis(benzoxazolyl-2-sulfonyl) diazomethane, bis(4-dimethylaminophenylsulfonyl) diazomethane and bis(5-dimethylamino-1-naphthyl) disulfone.

9 Claims, No Drawings

CHEMICAL-SENSITIZATION POSITIVE-WORKING PHOTORESIST COMPOSITION

BACKGROUND OF THE INVENTION

The present invention relates to a novel chemical-sensitization positive-working photoresist composition or, more particularly, to a chemical-sensitization positive-working photoresist composition capable of giving a patterned resist layer with high pattern resolution with high photosensitivity as well as an excellent cross sectional profile and heat resistance of the patterned resist layer and also having an advantage in respect of the stability of the latent image before development after pattern-wise exposure to actinic rays with little dependency on the nature of the substrate surface on which the photoresist layer is formed.

In the photolithographic patterning technology in the manufacture of various kinds of semiconductor devices, liquid crystal display panels and the like by utilizing a photoresist composition, it is a remarkable trend in recent years that so-called chemical-sensitization photoresist compositions are acquiring more and more prevalence among various types of photoresist compositions. The chemical-sensitization photoresist composition here implied is a photoresist composition containing an chemical agent capable of releasing an acid by the irradiation with actinic rays while the thus generated acid has a catalytic activity on the radiation-induced changes in the solubility of the resinous ingredient in an aqueous alkaline developer solution so that the photoresist composition containing even a relatively small amount of the acid-generating agent may have a high photosensitivity with a relatively small exposure dose.

Chemical-sensitization photoresist compositions can be classified into two types including the positive-working photoresist compositions and negative-working photoresist compositions depending on the solubility changes of the resist layer in an alkaline developer solution caused by the irradiation with actinic rays. The basic ingredients of a chemical-sensitization photoresist composition of each type include the above mentioned radiation-sensitive acid-generating agent and a film-forming resinous ingredient which causes a change in the solubility in an aqueous alkaline developer solution by interacting with the acid released from the acid-generating agent by the pattern-wise exposure of the resist layer to actinic rays.

The formulations of the chemical-sensitization positive- and negative-working photoresist compositions are different in the film-forming resinous ingredients. Namely, the chemical-sensitization positive-working photoresist composition usually contains, as the film-forming resinous ingredient, a polyhydroxystyrene resin which is substituted for the hydrogen atoms of a part of the hydroxyl groups by solubility-reducing protective groups such as tert-butoxycarbonyl groups, tetrahydropyranyl groups and the like while the film-forming resinous ingredient in the chemical-sensitization negative-working photoresist composition is usually a combination of a polyhydroxystyrene resin of which, optionally, a part of the hydroxyl groups are substituted for the hydroxyl hydrogen atoms by solubility-reducing protective groups mentioned above or a novolak resin with an acid-crosslinkable agent such as melamine resins, urea resins and the like.

Various attempts and proposals have been made heretofore for selection of the radiation-sensitive acid-generating agent used in the above described chemical-sensitization photoresist compositions including, for example, certain diazomethane compounds disclosed in Japanese Patent Kokai 3-103854, 4-210960 and 4-217249. The diazomethane compounds disclosed there and used in the formulation of a chemical-sensitization positive-working photoresist composition include bis(heteroarylsulfonyl) diazomethanes such as bis(imidazolylsulfonyl) diazomethane, bis(2-methylimidazolylsulfonyl) diazomethane, bis(benzoimidazolyl-2-sulfonyl) diazomethane, bis(benzoxazolyl-2-sulfonyl) diazomethane, bis(benzothiazolyl-2-sulfonyl) diazomethane and the like.

While a chemical-sensitization positive-working photoresist composition is basically a ternary composition comprising an alkali-soluble resin, an acetal-based solubility-reducing agent and an acid-generating agent, such a photoresist composition is not always quite satisfactory for the ultrafine patterning of a quarter-micron fineness recently under development in respects of the pattern resolution and influences of the standing waves on the cross sectional profile of the patterned resist layer to cause waviness on the side lines.

On the other hand, use of an aryl disulfone compound as an acid-generating agent is proposed in Japanese Patent Kokai 61-166544, 3-289658 and 5-94017. The photoresist compositions containing an acid-generating compound of this type, however, are not quite satisfactory in respects of pattern resolution, photosensitivity and stability of the latent image formed in the resist layer.

SUMMARY OF THE INVENTION

The present invention accordingly has an object to provide a novel chemical-sensitization positive-working photoresist composition which is capable of giving a patterned resist layer with high photosensitivity and high pattern resolution and an excellently orthogonal cross sectional profile of the patterned resist layer and also is advantageous in respect of the stability of the latent image formed by the pattern-wise exposure of the photoresist layer to actinic rays before post-exposure baking treatment and development as well as in respect of high heat resistance and little dependency on the nature of the substrate surface. The discovery leading to completion of the present invention is that the above mentioned high performance of the positive-working photoresist composition can be accomplished by the use of a specific disulfone compound as the radiation-sensitive acid-generating agent.

Thus, the present invention provides a chemical-sensitization positive-working photoresist composition which comprises, as a uniform solution in an organic solvent:

(A) 100 parts by weight of a film-forming resin having hydroxyl groups substituted for the hydrogen atoms by acid-dissociable groups and having such a molecular weight distribution that the ratio of the weight-average molecular weight $M_w$ to the number-average molecular weight $M_n$ does not exceed 3.5, which causes an increase of solubility in an aqueous alkaline solution by interacting with an acid; and (B) from 0.5 to 20 parts by weight of a radiation-sensitive acid-generating agent which is a disulfone compound represented by the general formula $$R^1\text{—}SO_2\text{—}(C\!\!=\!\!N_2)_n\text{—}SO_2\text{—}R^2, \qquad (I)$$

in which the subscript n is 0 or 1 and $R^1$ and $R^2$ are each, independently from the other, a monovalent aromatic group selected from the group consisting of pyridyl group, benzoxazolyl group and aryl groups having at least one amino group or dialkylamino group.

Particularly preferable disulfone compounds as the acid-generating agent in the formulation of the inventive positive-working photoresist composition include those compounds of the general formula (I) in which the subscript n is 1 and $R^1$ and $R^2$ are each a pyridyl group, benzoxazolyl group or an aryl group having at least one amino group or di(lower alkyl)amino group and those compounds of the general formula (I) in which the subscript n is 0 and $R^1$ and $R^2$ are each an aryl group having at least one amino group or di(lower alkyl)amino group.

DETAILED DESCRIPTION OF THE PREFERRED EMBODIMENTS

The component (A) in the inventive positive-working photoresist composition is a film-forming resin having hydroxyl groups substituted for the hydrogen atoms by acid-dissociable groups and having such a molecular weight distribution that the ratio of the weight-average molecular weight $M_w$ to the number-average molecular weight $M_n$ does not exceed 3.5, which causes an increase of solubility in an aqueous alkaline solution by interacting with an acid. Such a resin is typically exemplified by hydroxystyrene-based resins including homopolymers of a hydroxystyrene, copolymers of a hydroxystyrene and other styrene monomers and copolymers of a hydroxystyrene and (meth)acrylic acid or a derivative thereof, which are substituted for a part of the hydroxyl groups by acid-dissociable protective groups, as well as copolymers of (meth)acrylic acid and a derivative thereof, which are substituted for a part of the carboxylic hydroxyl groups by acid-dissociable protective groups.

The above mentioned styrene monomer copolymerizable with a hydroxystyrene is exemplified by styrene, α-methylstyrene, p- and o-methylstyrenes, p-methoxystyrene and p-chlorostyrene. The above mentioned derivative of (meth)acrylic acid is exemplified by methyl (meth)acrylate, ethyl (meth)acrylate, 2-hydroxyethyl (meth)acrylate, 2-hydroxypropyl (meth)acrylate, (meth)acrylamide and (meth)acrylonitrile.

It is important that the resin as the component (A) has a low dispersion of the molecular weight distribution with an $M_w:M_n$ ratio not exceeding 3.5. Several grades of commercial products are available as a resin of such a low molecular-weight dispersion and can be used as such as the component (A). Such a resin can of course be prepared by the fractionation treatment of a resin having a broader molecular weight distribution according to a known procedure.

The acid-dissociable protective group to substitute for a part of the hydroxyl groups in the above mentioned hydroxyl-containing resin is exemplified by tert-alkyloxycarbonyl groups such as tert-butoxycarbonyl and tert-amyloxycarbonyl groups, tert-alkoxycarbonylalkyl groups such as tert-butoxycarbonylmethyl group, tert-alkyl groups such as tert-butyl group, alkoxyalkyl groups such as ethoxyethyl and methoxypropyl groups, acetal groups such as tetrahydropyranyl and tetrahydrofuranyl groups, benzyl group, trimethylsilyl group and so on.

It is preferable that the degree of substitution of these protective groups for the hydroxyl groups of the hydroxyl group-containing resin is in the range from 1 to 60% or, more preferably, from 10 to 50%.

As is mentioned above, the film-forming resin as the component (A) should have a molecular weight distribution as narrow as possible in order to impart the photoresist composition containing the same with increased heat resistance and pattern resolution of the resist layer. In this regard, the $M_w:M_n$ ratio as an index for the molecular weight distribution should not exceed 3.5 or, preferably, should not exceed 2.5 or, more preferably, should not exceed 1.5. The values of molecular weight can be determined by the method of gel permeation chromatography by making reference to polystyrene samples having known molecular weights.

A particularly preferable resinous ingredient as the component (A) in the inventive positive-working photoresist composition is a combination of two different resins, of which one is a first polyhydroxystyrene with an $M_w:M_n$ ratio not exceeding 3.5 substituted by tert-butoxycarbonyl groups for 10 to 50% or, more preferably, 15 to 40% of the hydroxyl groups and the other is a second polyhydroxystyrene with an $M_w:M_n$ ratio not exceeding 3.5 substituted by alkoxyalkyl groups such as 1-ethoxyethyl and 1-methoxypropyl groups for 10 to 50% or, more preferably, 15 to 40% of the hydroxyl groups, in a weight ratio in the range from 5:95 to 50:50 or, preferably, from 10:90 to 30:70.

The radiation-sensitive acid-generating agent as the component (B) in the chemical-sensitization positive-working photoresist composition of the invention is a disulfone compound represented by the general formula

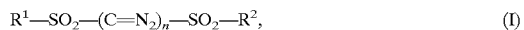

$$R^1-SO_2-(C=N_2)_n-SO_2-R^2, \quad (I)$$

in which the subscript n is 0 or 1 and $R^1$ and $R^2$ are each, independently from the other, a monovalent aromatic group selected from the group consisting of pyridyl group, benzoxazolyl group and aryl groups having at least one amino group or dialkylamino group.

Particularly preferable disulfone compounds as the acid-generating agent in the formulation of the inventive positive-working photoresist composition include, on one hand, those disulfone compounds of the general formula (I) in which the subscript n is 1 and $R^1$ and $R^2$ are each a pyridyl group, benzoxazolyl group or an aryl group having at least one amino group or di(lower alkyl)amino group or, namely, those diazomethane disulfone compounds represented by the general formula

$$R^3-SO_2-(C=N_2)-SO_2-R^4, \quad (Ia)$$

in which $R^3$ and $R^4$ are each, independently from the other, a pyridyl group, benzoxazolyl group or an aryl group having at least one amino group or di(lower alkyl)amino group, and, on the other hand, those compounds of the general formula (I) in which the subscript n is 0 and $R^1$ and $R^2$ are each an aryl groups having at least one amino group or di(lower alkyl)amino group or, namely, those disulfone compounds represented by the general formula

$$R^5-SO_2-SO_2-R^6, \quad (Ib)$$

in which $R^5$ and $R^6$ are each, independently from the other, an aryl groups having at least one amino group or dialkylamino group, the alkyl group having 1 to 4 carbon atoms.

The disulfone compounds defined above with reference to the formula (Ia) or (Ib) are advantageous as the acid-generating agent because the positive-working photoresist composition formulated therewith exhibits excellent stability of the latent images formed in the resist layer by the pattern-wise exposure to light when the resist layer with the latent image is kept standing for a length of time before the post-exposure baking treatment of the resist layer while the patterned resist layer formed from a conventional photoresist composition sometimes has an undercut with extending top flat in the cross sectional profile when the resist layer is kept standing before the post-exposure baking treatment. Further, the photoresist composition is advantageous in respect of little dependency of the patterned resist layer on the nature of the substrate provided with a surface film of an insulating material such as silicon nitride, borophosphosilicate glass and the like or a conductive material such as titanium nitride, aluminum-silicon-copper alloys, tungsten and the like exempting the patterned resist layer from having a trailing cross sectional profile.

The groups denoted by $R^3$ and $R^4$ in the general formula (Ia) are each preferably an aryl group having at least one amino group or di(lower alkyl)amino group. The aryl group to be substituted by an amino group or a dialkylamino group to form the groups $R^3$, $R^4$, $R^5$ and $R^6$ is preferably a phenyl or naphthyl group. More preferably, the groups denoted by $R^3$ and $R^4$ are each a dimethylamino-substituted phenyl group and the groups denoted by $R^5$ and $R^6$ are each a dimethylamino-substituted naphthyl group. It is optional that the aryl group forming $R^3$, $R^4$, $R^5$ and $R^6$ is further substituted by other substituents such as alkyl groups, alkoxy groups and halogen atoms to such an extent as not to cause an undue decrease in the advantages accomplished by the present invention.

The diazomethane disulfone compound of the general formula (Ia) can be synthesized by a known method disclosed, for example, in Japanese Patent Kokai 4-210960. When the groups denoted by $R^3$ and $R^4$ are the same groups, for example, a thiol compound of the formula $R^3SH$ is reacted with dichloromethane $CH_2Cl_2$ in an organic solvent which is an alcohol such as methyl and ethyl alcohols or an aromatic hydrocarbon solvent such as toluene in the presence of a base compound such as triethylamine to form a disulfide compound of the formula $R^3SCH_2SR^3$, which is oxidized with hydrogen peroxide in a solvent which may be water or an alcohol, e.g., methyl and ethyl alcohols, in the presence of a catalyst such as sodium tungstate to give a methane disulfone compound of the formula $R^3SO_2CH_2SO_2R^3$ followed by the reaction of this disulfone compound with tosyl azide in an organic solvent which is an alcohol such as methyl and ethyl alcohols or an aromatic hydrocarbon solvent such as toluene in the presence of a base compound such as triethylamine to form the desired diazomethane disulfone compound.

When the groups denoted by $R^3$ and $R^4$ in the general formula (Ia) are different each from the other, hydrogen chloride gas is introduced at 10° C. or below into a mixture of a first thiol compound of the formula $R^3SH$ and paraformaldehyde $(CH_2O)_p$ and then anhydrous calcium chloride is added to the mixture at 10° C. or below to form a compound of the formula $R^3SCH_2Cl$ which is reacted with a second thiol compound of the formula $R^4SH$ in an organic solvent which is an alcohol such as methyl and ethyl alcohols or an aromatic hydrocarbon solvent such as toluene in the presence of a base compound such as sodium hydroxide to form a disulfide compound of the formula $R^3SCH_2SR^4$, which is oxidized with hydrogen peroxide and then reacted with tosyl azide in the same manner as described above to give the desired diazomethane disulfone compound.

Diazomethane disulfone compounds, of which the groups $R^3$ and $R^4$ in the general formula (Ia) are the same groups, are preferred practically to those of which the groups $R^3$ and $R^4$ are different each from the other because of the more convenient and less expensive synthetic procedure.

Examples of the diazomethane disulfone compound of the general formula (Ia) include:

bis(4-pyridylsulfonyl) diazomethane of the formula

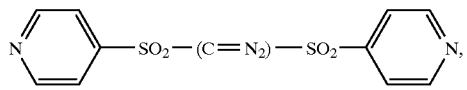

bis(benzoxazolyl-2-sulfonyl) diazomethane of the formula

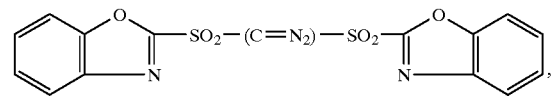

and
bis(4-dimethylaminophenylsulfonyl) diazomethane of the formula

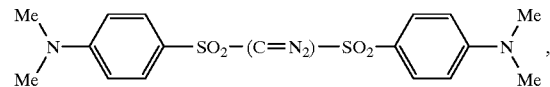

in which Me is a methyl group.

The disulfone compound of the general formula (Ib) is exemplified by bis(5-dimethylamino-1-naphthyl) disulfone of the formula

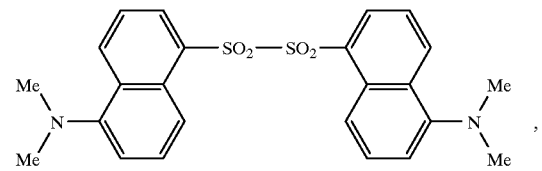

in which Me is a methyl group.

The disulfone compounds of the general formula (I) or, in particular, general formulas (Ia) and (Ib) as the acid-generating agent of the component (B) can be used either singly or as a combination of two kinds or more according to need. The amount of the component (B) in the inventive photoresist composition is in the range from 0.5 to 20 parts by weight or, preferably, from 1 to 10 parts by weight per 100 parts by weight of the resinous ingredient as the component (A) in respect of obtaining good balance of the properties such as image-formability, film-formability and developability. When the amount of the component (B) is too small, pattern reproduction can be accomplished only insufficiently while, when the amount thereof is too large, a decrease is caused in the uniformity of the resist layer formed on the substrate surface along with a decrease in the developability not to give an excellently patterned resist layer.

It is further optional in the formulation of the inventive photoresist composition that the acid-generating agent is a combination of the above described specific disulfone compound with one or more of conventional radiation-sensitive acid-generating compounds used in chemical-sensitization photoresist compositions, of which diazomethane compounds, such as bis(cyclohexylsulfonyl) diazomethane, are preferred, in such a limited proportion that no undue decrease is caused in the advantages accomplished in the present invention.

The chemical-sensitization positive-working photoresist composition of the present invention can optionally be admixed with an amine compound to improve the quality of the photoresist layer and the patterned resist layer therefrom such as the orthogonality of the cross sectional profile of the patterned resist layer and stability of the latent image formed by the pattern-wise exposure of the photoresist layer to actinic rays before the post-exposure baking treatment and development treatment. Examples of suitable amine compounds include, for example, aliphatic amines such as trimethyl amine, ethyl amine, diethyl amine, triethyl amine, n-propyl amine, di-n-propyl amine, tri-n-propyl amine and the like, aromatic amines such as benzylamine, aniline, N-methyl aniline, N,N-dimethyl aniline and the like and heterocyclic amines such as pyridine, 2-methyl pyridine, 2-ethyl pyridine, 2,3-dimethyl pyridine and the like, of which triethyl amine is particularly effective in respect of the efficiency of improvement in the above mentioned properties. The amount of the above mentioned amine compounds in the inventive photoresist composition is, when added, in the range from 0.01 to 1% by weight or, preferably, from 0.05 to 0.5% by weight based on the component (A) in order to accomplish an excellent cross sectional profile of the patterned resist layer and high sensitivity of the photoresist composition.

It is further optional according to need that the photoresist composition of the invention is admixed with a carboxylic acid including saturated and unsaturated aliphatic carboxylic acids such as butyric acid, isobutyric acid, oxalic acid, malonic acid, succinic acid, acrylic acid, crotonic acid, isocrotonic acid, 3-butenoic acid, methacrylic acid, 4-pentenoic acid and the like, alicyclic carboxylic acids such as 1,1-cyclohexane dicarboxylic acid, 1,2-cyclohexane dicarboxylic acid, 1,3-cyclohexane dicarboxylic acid, 1,4-cyclohexane dicarboxylic acid, 1,1-cyclohexyl diacetic acid and the like, and aromatic carboxylic acids having a hydroxyl group, nitro group, carboxyl group, vinyl group and the like as a substituent such as p-hydroxy benzoic acid, o-hydroxy benzoic acid, 2-hydroxy-3-nitro benzoic acid, 3,5-dinitro benzoic acid, 2-nitro benzoic acid, 2,4-dihydroxy benzoic acid, 2,5-dihydroxy benzoic acid, 2,6-dihydroxy benzoic acid, 3,4-dihydroxy benzoic acid, 3,5-dihydroxy benzoic acid, 2-vinyl benzoic acid, 4-vinyl benzoic acid, phthalic acid, terephthalic acid, isophthalic acid and the like, of which the aromatic carboxylic acids are preferable in respect of their adequate acidity. Salicylic acid, i.e. o-hydroxy benzoic acid, is more preferable in respect of its good solubility in the organic solvents of the composition and the good pattern-forming behavior on the substrates of various materials. The amount of the above mentioned carboxylic acid compound in the inventive photoresist composition is, when added, in the range from 0.01 to 10% by weight or, preferably, from 0.05 to 2.0% by weight based on the component (A) for the same reasons as for the above mentioned amine compounds.

The chemical-sensitization photoresist composition is used preferably in the form of a uniform solution prepared by dissolving the above described essential and optional ingredients in an organic solvent. Examples of suitable organic solvents include: ketone solvents such as acetone, methyl ethyl ketone, cyclohexanone, methyl isoamyl ketone and 2-heptanone; polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof; cyclic ether solvents such as dioxane; ester solvents such as methyl lactate, ethyl lactate, methyl acetate, ethyl acetate, butyl acetate, methyl pyruvate, ethyl pyruvate, methyl methoxypropionate and ethyl ethoxypropionate; and amide solvents such as N,N-dimethyl formamide, N,N-dimethyl acetamide and N-methyl-2-pyrrolidone. These organic solvents can be used either singly or as a mixture of two kinds or more according to need.

It is of course optional that the chemical-sensitization positive-working photoresist composition of the present invention is admixed with various known additives having compatibility with the above described essential and optional ingredients. Examples of such an additive include auxiliary resins to improve the properties of the resist film, plasticizers, stabilizers, surface active agents and so on conventionally used as the ingredients in photoresist compositions.

The photolithographic patterning procedure by using the chemical-sensitization positive-working photoresist composition of the invention can be the same as the procedure by the use of a conventional photoresist composition. Namely, a substrate such as a semiconductor silicon wafer is coated with the photoresist composition by using a suitable coating machine such as spinners to form a coating layer of the composition followed by drying to give a dried photoresist layer which is pattern-wise exposed to actinic rays such as ultraviolet light, deep ultraviolet light, excimer laser beams and the like, for example, on a minifying projection exposure machine through a photomask bearing a desired pattern or irradiated pattern-wise by scanning with electron beams to form a latent image of the pattern followed by a post-exposure baking treatment. Thereafter, the latent image of the pattern is developed with an aqueous alkaline solution as a developer such as a 1 to 10% by weight aqueous solution of tetramethylammonium hydroxide to form a patterned resist layer having high fidelity to the photomask pattern by dissolving away the resist layer in the areas exposed to actinic rays.

One of the advantages obtained with the inventive photoresist composition is that the stability of the latent images of the pattern formed by the pattern-wise exposure to light is high before the post-exposure baking treatment in addition to the advantages of high pattern resolution and high photosensitivity of the photoresist layer as well as excellently orthogonal cross sectional profile and high heat resistance of the pattered resist layer with little dependency on the nature of the substrate surface so that the inventive photoresist composition is useful in the manufacture of semiconductor devices in which ultrafine patterning is required.

In the following, the chemical-sensitization photoresist composition of the invention is illustrated in more detail by way of Examples and Comparative Examples, in which the positive-working photoresist compositions were evaluated for the following items by the testing procedures described there.

(1) Photosensitivity

A silicon wafer was coated with the photoresist composition under testing by using a spinner to form a coating layer which was dried by heating on a hot plate at 90° C. for 90 seconds to give a dried photoresist layer having a thickness of 0.7 $\mu$m. The photoresist layer was pattern-wise exposed to ultraviolet light on a minifying projection exposure machine (Model NSR-2005EX8A, manufactured by Nikon Co.) in an exposure dose increased step-wise with 1 mJ/cm$^2$ increments to form a latent image of the pattern followed by a post-exposure baking treatment at 110° C. for 90 seconds. Subsequently, the thus pattern-wise exposed photoresist layer was immediately subjected to a development treatment by using a 2.38% by weight aqueous solution of tetramethylammonium hydroxide for 60 seconds at 23° C. followed by rinse in a running water stream for 30 seconds and drying. The minimum exposure dose in mJ/cm$^2$ was recorded as a measure of the photosensitivity of the composition by which the resist layer in the exposed areas could be completely dissolved away in the development treatment.

(2) Pattern resolution

The resolution of the patterned resist layer was estimated in terms of the critical resolution at the exposure dose which was sufficient for reproduction of a mask pattern of 0.25 μm line width by undertaking the same patterning procedure as in (1) above.

(3) Cross sectional profile of patterned resist layer

A resist layer in a line-and-space pattern of 0.25 μm line width was obtained in the same manner as in (1) described above and the cross sectional profile thereof was examined and recorded in two ratings of: A when the cross section had an orthogonal profile; and B when the cross section was trapezoidal or when waviness was found on the side lines.

(4) Stability of latent images before development

A resist layer patterned in a line-and-space pattern of 0.25 μm line width was prepared in the same manner as in (1) above excepting for standing of the pattern-wise exposed photoresist layer for 60 minutes at room temperature before the post-exposure baking treatment at 110° C. for 90 seconds followed by the development treatment. The cross sectional profile of the thus obtained line-and-space patterned resist layer was examined on a scanning electron microscopic photograph to record the results in five ratings of: 5 when the ratio of the line width to the space width was 1:1; 3 when the line width was larger than 0.25 μm and the space width was smaller than 0.25 μm; and 1 when no resolution of the pattern could be obtained, the intermediate conditions of 5 and 3 and of 3 and 1 being rated as 4 and 2, respectively.

(5) Substrate dependency of cross sectional pattern profile

Patterned resist layers were formed in the same manner as in (1) described above on three substrates of silicon wafers provided with a surface coating of (1) silicon nitride, (2) titanium nitride and (3) insulating borophospho silicate glass and the cross sectional profile of the line-and-space pattern of 0.25 μm line width was examined on a scanning electron microscopic photograph to record the results in two ratings of: A when the cross sectional profile had good orthogonality and B when trailing was found in the cross sectional profile on the substrate surface.

(6) Heat resistance of patterned resist layer

A line-patterned resist layer having a width of about 100 μm was formed in substantially the same manner as in (1) described above and the substrate having the patterned resist layer was heated on a hot plate at 120° C. for 5 minutes. The cross sectional profile of the patterned resist layer was examined on a scanning electron microscopic photograph to record the results in three ratings of: A when the cross sectional profile was orthogonal or trapezoidal, B when the side lines of the cross sectional profile were curved and C when the cross sectional profile was rounded as a whole.

EXAMPLE 1

A positive-working chemical-sensitization photoresist composition was prepared in the following manner. Thus, 30 parts by weight of a first polyhydroxystyrene resin having a weight-average molecular weight of 10000 with an $M_w:M_n$ ratio of 1.5, which was substituted by tert-butyloxycarbonyl groups for 39% of the hydroxyl groups, 70 parts by weight of a second polyhydroxystyrene resin having a weight-average molecular weight of 10000 with an $M_w:M_n$ ratio of 1.5, which was substituted by ethoxyethyl groups for 39% of the hydroxyl groups, 3 parts by weight of bis(4-pyridylsulfonyl) diazomethane as the acid-generating agent, 0.3 part by weight of triethyl amine and 0.2 part by weight of salicylic acid were dissolved in 490 parts by weight of propyleneglycol monomethyl ether acetate and the solution was filtered through a membrane filter of 0.2 μm pore diameter to give a uniform photoresist solution, which was subjected to the evaluation tests in the above described procedures to give the results shown in Table 1 below.

EXAMPLE 2

The experimental procedure was just the same as in Example 1 excepting for the replacement of the acid-generating agent with the same amount of bis(benzoxazolyl-2-sulfonyl) diazomethane. The results of the evaluation tests are shown also in Table 1.

EXAMPLE 3

The experimental procedure was just the same as in Example 1 excepting for the replacement of the acid-generating agent with the same amount of bis(5-dimethylamino-1-naphthyl) disulfone. The results of the evaluation tests are shown also in Table 1.

EXAMPLE 4

The experimental procedure was just the same as in Example 1 excepting for the replacement of 3 parts by weight of the acid-generating agent with a mixture of 3 parts by weight of bis(cyclohexylsulfonyl) diazomethane and 1 part by weight of bis(4-dimethylaminophenylsulfonyl) diazomethane and replacement of propyleneglycol monomethyl ether acetate as the solvent with the same amount of ethyl lactate. The results of the evaluation tests are shown also in Table 1.

Comparative Examples 1 to 3

The experimental procedure in each of these Comparative Examples was just the same as in Example 1 excepting for the replacement of 3 parts by weight of the acid-generating agent with 5 parts by weight of pyrogallol trimesylate, 5 parts by weight of bis(cyclohexylsulfonyl) diazomethane or 3 parts by weight of bis(4-tert-butylphenyl)iodonium trifluoromethane-sulfonate, respectively. The results of the evaluation tests are shown also in Table 1.

Comparative Example 4

The experimental procedure was just the same as in Example 1 excepting for the replacement of the resinous ingredient consisting of two different polyhydroxystyrene resins with 100 parts by weight of a single polyhydroxystyrene resin having a weight-average molecular weight of 10000 with an $M_w:M_n$ ratio of 4.0, which was substituted by tert-butyloxycarbonyl groups for 39% of the hydroxyl groups. The results of the evaluation tests are shown also in Table 1.

Comparative Example 5

The experimental procedure was just the same as in Example 2 excepting for the replacement of the resinous ingredient consisting of two different polyhydroxystyrene resins with 100 parts by weight of a single polyhydroxystyrene resin having a weight-average molecular weight of 10000 with an $M_w:M_n$ ratio of 4.0, which was substituted by ethoxyethyl groups for 39% of the hydroxyl groups. The results of the evaluation tests are shown also in Table 1.

Comparative Example 6

The experimental procedure was just the same as in Example 3 excepting for the replacement of the resinous ingredient consisting of two different polyhydroxystyrene resins with a combination of 30 parts by weight of the same polyhydroxystyrene resin as used in Comparative Example 4 and 70 parts by weight of the same polyhydroxystyrene resin as used in Comparative Example 5. The results of the evaluation tests are shown also in Table 1.

TABLE 1

|  |  | Photo-sensitivity, mJ/cm² | Pattern resolution, μm | Cross sectional profile | Stability of latent image | Substrate dependency | Heat resistance |
|---|---|---|---|---|---|---|---|
| Example | 1 | 15 | 0.22 | A | 5 | A for (1) & (2) | A |
|  | 2 | 18 | 0.22 | A | 5 | A for (2) & (3) | A |
|  | 3 | 15 | 0.22 | A | 5 | A for (1) & (3) | A |
|  | 4 | 15 | 0.22 | A | 5 | A for (1) & (2) | A |
| Comparative Example | 1 | 20 | 0.23 | B | 1 | B for (1) & (2) | A |
|  | 2 | 15 | 0.20 | A | 3 | A for (2) & (3) | A |
|  | 3 | 7 | 0.22 | B | 1 | B for (1) & (3) | A |
|  | 4 | 14 | 0.25 | B | 3 | B for (1) & (2) | A |
|  | 5 | 17 | 0.23 | A | 4 | A for (2) & (3) | C |
|  | 6 | 14 | 0.23 | A | 4 | A for (1) & (3) | B |

What is claimed is:

1. A chemical-sensitization positive-working photoresist composition which comprises, as a uniform solution in an organic solvent:

(A) 100 parts by weight of a film-forming polyhydroxystyrene resin wherein at least a part of the hydroxy groups are substituted by acid-dissociable groups and having a molecular weight distribution such that the ratio of the weight-average molecular weight $M_w$ to the number-average molecular weight $M_n$ does not exceed 3.5, which causes an increase of solubility in an aqueous alkaline solution by the interaction with an acid; and (B) from 0.5 to 20 parts by weight of a radiation-sensitive acid-generating agent which is a disulfone compound represented by the general formula $$R^1—SO_2—(C=N_2)_n—SO_2—R^2,$$

in which the subscript n is 1 and $R^1$ and $R^2$ are each, independently from the other, a pyridyl group, an aryl group substituted by at least one amino group or dialkylamino group.

2. The chemical-sensitization positive-working photoresist composition as claimed in claim 1 in which $R^1$ and $R^2$ are each a phenyl group substituted by at least one dimethylamino group.

3. The chemical-sensitization positive-working photoresist composition as claimed in claim 1 which further comprises, per 100 parts by weight of the component (A), from 0.01 to 1 part by weight of an amine compound, from 0.01 to 10 parts by weight of a carboxylic acid compound or a combination thereof.

4. The chemical-sensitization positive-working photoresist composition as claimed in claim 1 in which the acid-dissociable group substituting for at least a part of the hydroxy groups of the polyhydroxystyrene resin is selected from the group consisting of tert-alkyloxycarbonyl groups, tert-alkoxycarbonylalkyl groups, alkoxyalkyl groups and acetal groups.

5. The chemical-sensitization positive-working photoresist composition as claimed in claim 1 in which the film-forming resin is substituted by the acid-dissociable groups for from 1 to 60% of the hydroxy groups.

6. The chemical-sensitization positive-working photoresist composition as claimed in claim 1 in which the film-forming hydroxy group-containing resin has a molecular weight distribution such that the ratio of the weight-average molecular weight $M_w$ to the number-average molecular weight $M_n$ does not exceed 2.5.

7. The chemical-sensitization positive-working photoresist composition as claimed in claim 1 in which the component (A) is a combination of a first polyhydroxystyrene resin substituted by tert-butoxycarbonyl groups for 10 to 50% of the hydroxy groups and a second polyhydroxystyrene resin substituted by alkoxyalkyl groups for 10 to 50% of the hydroxy groups in a weight proportion in the range from 5:95 to 50:50.

8. The chemical-sensitization positive-working photoresist composition as claimed in claim 1 in which the component (B) is bis(4-dimethylaminophenylsulfonyl) diazomethane.

9. The chemical-sensitization positive-working photoresist composition as claimed in claim 1 in which the amount of the component (B) is in the range from 1 to 10 parts by weight per 100 parts by weight of the component (A).

* * * * *

UNITED STATES PATENT AND TRADEMARK OFFICE
CERTIFICATE OF CORRECTION

PATENT NO. : 5,945,248
DATED : August 31, 1999
INVENTOR(S) : Kazuyuki NITTA et al.

It is certified that error appears in the above-identified patent and that said Letters Patent is hereby corrected as shown below:

Column 11, line 45 (claim 1), change "a pyridyl group" to --a pyridyl group or--.

Signed and Sealed this

Twenty-first Day of March, 2000

*Attest:*

Q. TODD DICKINSON

*Attesting Officer*   *Commissioner of Patents and Trademarks*